US008637413B2

(12) United States Patent
Chen et al.

(10) Patent No.: US 8,637,413 B2
(45) Date of Patent: Jan. 28, 2014

(54) NONVOLATILE RESISTIVE MEMORY ELEMENT WITH A PASSIVATED SWITCHING LAYER

(75) Inventors: Charlene Chen, San Jose, CA (US); Dipankar Pramanik, Saratoga, CA (US)

(73) Assignees: Sandisk 3D LLC, Milpitas, CA (US); Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/309,813

(22) Filed: Dec. 2, 2011

(65) Prior Publication Data

US 2013/0140512 A1 Jun. 6, 2013

(51) Int. Cl.

| | |
|---|---|
| ***H01L 21/31*** | (2006.01) |
| ***H01L 29/00*** | (2006.01) |
| ***G11C 11/00*** | (2006.01) |

(52) U.S. Cl.

USPC ............ 438/784; 257/E47.001; 257/E21.002; 257/E21.27; 365/148

(58) Field of Classification Search

CPC .. C23C 16/404; H01C 7/006; H01L 45/1145; H01L 27/016; G11C 13/0006; G11C 13/0007; G11C 13/0069

USPC .................. 257/2, 4, 537, E47.001, E21.002, 257/E21.07; 365/148; 438/104, 384, 478, 438/784

See application file for complete search history.

(56) References Cited

U.S. PATENT DOCUMENTS

| | | | |
|---|---|---|---|
| 5,311,039 | A | 5/1994 | Kimura et al. |
| 5,373,169 | A | 12/1994 | McCollum et al. |
| 5,379,250 | A | 1/1995 | Harshfield |
| 5,475,253 | A | 12/1995 | Look et al. |
| 5,486,707 | A | 1/1996 | Look et al. |
| 5,818,749 | A | 10/1998 | Harshfield |
| 5,915,167 | A | 6/1999 | Leedy |
| 6,034,882 | A | 3/2000 | Johnson et al. |
| 6,100,120 | A | 8/2000 | Yu |
| 6,306,715 | B1 | 10/2001 | Chan et al. |
| 6,342,414 | B1 | 1/2002 | Xiang et al. |
| 6,351,406 | B1 | 2/2002 | Johnson et al. |
| 6,369,421 | B1 | 4/2002 | Xiang et al. |
| 6,376,787 | B1 | 4/2002 | Martin et al. |
| 6,403,434 | B1 | 6/2002 | Yu |
| 6,420,215 | B1 | 7/2002 | Knall et al. |

(Continued)

FOREIGN PATENT DOCUMENTS

| | | |
|---|---|---|
| JP | 08-316324 | 11/1996 |
| JP | 05-123575 | 5/2005 |
| WO | WO2005124787 | 12/2005 |

OTHER PUBLICATIONS

Nardi, F. et al., "Control of Filament Size and Reduction of Reset Current Below 10 uA in NiO Resistance Switching Memories," Academia—Politecnico di Milano; Solid-State Electronics 58, 2011 pp. 42-47.

(Continued)

*Primary Examiner* — Nikolay Yushin

(74) *Attorney, Agent, or Firm* — Vierra Magen Marcus LLP

(57) ABSTRACT

A nonvolatile resistive memory element has a novel variable resistance layer that is passivated with non-metallic dopant atoms, such as nitrogen, either during or after deposition of the switching layer. The presence of the non-metallic dopant atoms in the variable resistance layer enables the switching layer to operate with reduced switching current while maintaining improved data retention properties.

17 Claims, 4 Drawing Sheets

(56) References Cited

U.S. PATENT DOCUMENTS

| | | | |
|---|---|---|---|
| 6,426,891 | B1 | 7/2002 | Katori |
| 6,434,060 | B1 | 8/2002 | Tran et al. |
| 6,451,641 | B1 | 9/2002 | Halliyal et al. |
| 6,451,647 | B1 | 9/2002 | Yang et al. |
| 6,455,424 | B1 | 9/2002 | McTeer et al. |
| 6,456,524 | B1 | 9/2002 | Perner et al. |
| 6,465,804 | B1 | 10/2002 | Shamir |
| 6,475,874 | B2 | 11/2002 | Xiang et al. |
| 6,483,734 | B1 | 11/2002 | Sharma et al. |
| 6,486,065 | B2 | 11/2002 | Vyvoda et al. |
| 6,490,218 | B1 | 12/2002 | Vyvoda et al. |
| 6,492,241 | B1 | 12/2002 | Rhodes et al. |
| 6,495,437 | B1 | 12/2002 | Yu |
| 6,514,808 | B1 | 2/2003 | Samavedam et al. |
| 6,515,888 | B2 | 2/2003 | Johnson et al. |
| 6,525,953 | B1 | 2/2003 | Johnson |
| 6,534,403 | B2 | 3/2003 | Cleeves |
| 6,534,841 | B1 | 3/2003 | Van Brocklin et al. |
| 6,549,447 | B1 | 4/2003 | Fricke et al. |
| 6,551,885 | B1 | 4/2003 | Yu |
| 6,552,409 | B2 | 4/2003 | Taussig et al. |
| 6,559,014 | B1 | 5/2003 | Jeon |
| 6,574,145 | B2 | 6/2003 | Kleveland et al. |
| 6,579,760 | B1 | 6/2003 | Lung |
| 6,580,115 | B2 | 6/2003 | Agarwal |
| 6,586,349 | B1 | 7/2003 | Jeon et al. |
| 6,587,394 | B2 | 7/2003 | Hogan |
| 6,617,639 | B1 | 9/2003 | Wang et al. |
| 6,661,691 | B2 | 12/2003 | Fricke et al. |
| 6,686,646 | B2 | 2/2004 | Lee |
| 6,689,644 | B2 | 2/2004 | Johnson |
| 6,690,597 | B1 | 2/2004 | Perlov et al. |
| 6,704,235 | B2 | 3/2004 | Knall et al. |
| 6,750,079 | B2 | 6/2004 | Lowrey |
| 6,753,561 | B1 | 6/2004 | Rinerson et al. |
| 6,784,517 | B2 | 8/2004 | Kleveland et al. |
| 6,816,410 | B2 | 11/2004 | Kleveland et al. |
| 6,822,888 | B2 | 11/2004 | Peng |
| 6,842,369 | B2 | 1/2005 | Koll et al. |
| 6,879,505 | B2 | 4/2005 | Scheuerlein |
| 6,906,361 | B2 | 6/2005 | Zhang |
| 6,937,507 | B2 | 8/2005 | Chen |
| 6,937,509 | B2 | 8/2005 | Perner et al. |
| 6,937,528 | B2 | 8/2005 | Hush et al. |
| 6,952,030 | B2 | 10/2005 | Herner et al. |
| 7,009,694 | B2 | 3/2006 | Hart et al. |
| 7,012,297 | B2 | 3/2006 | Bhattacharyya |
| 7,052,941 | B2 | 5/2006 | Lee |
| 7,172,840 | B2 | 2/2007 | Chen |
| 7,176,064 | B2 | 2/2007 | Herner et al. |
| 7,206,214 | B2 | 4/2007 | Hoefler et al. |
| 7,271,081 | B2 | 9/2007 | Li et al. |
| 7,303,971 | B2 | 12/2007 | Hsu et al. |
| 7,304,888 | B2 | 12/2007 | Knall |
| 7,405,465 | B2 | 7/2008 | Herner |
| 7,410,838 | B2 | 8/2008 | Ang |
| 7,453,755 | B2 | 11/2008 | Cleeves |
| 7,575,984 | B2 | 8/2009 | Radigan et al. |
| 7,608,514 | B2 | 10/2009 | Hsu |
| 7,629,198 | B2 | 12/2009 | Kumar et al. |
| 7,633,108 | B2 | 12/2009 | Li et al. |
| 7,649,768 | B2 | 1/2010 | Hirose |
| 7,863,598 | B2 | 1/2011 | Sugita et al. |
| 7,875,871 | B2 | 1/2011 | Kumar |
| 7,920,408 | B2 | 4/2011 | Azuma et al. |
| 7,968,419 | B2 | 6/2011 | Li et al. |
| 8,058,636 | B2 | 11/2011 | Osano et al. |
| 8,072,795 | B1 | 12/2011 | Wang et al. |
| 8,093,682 | B2 | 1/2012 | Hirose |
| 8,148,711 | B2 | 4/2012 | Fujii et al. |
| 8,183,553 | B2 | 5/2012 | Phatak et al. |
| 8,279,657 | B2 | 10/2012 | Takagi et al. |
| 8,339,834 | B2 | 12/2012 | Nakai et al. |
| 8,343,813 | B2 | 1/2013 | Kuse et al. |
| 8,410,467 | B2 | 4/2013 | Wada |
| 2002/0019039 | A1 | 2/2002 | Davis et al. |
| 2002/0070754 | A1 | 6/2002 | Lambertson |
| 2003/0026158 | A1 | 2/2003 | Knall et al. |
| 2003/0062595 | A1 | 4/2003 | Anthony |
| 2003/0081445 | A1 | 5/2003 | Van Brocklin et al. |
| 2003/0169625 | A1 | 9/2003 | Hush et al. |
| 2004/0002184 | A1 | 1/2004 | Cleeves |
| 2004/0016991 | A1 | 1/2004 | Johnson et al. |
| 2004/0108573 | A1 | 6/2004 | Herner et al. |
| 2004/0245547 | A1 | 12/2004 | Stipe |
| 2005/0014322 | A1 | 1/2005 | Herner et al. |
| 2005/0026334 | A1 | 2/2005 | Knall |
| 2005/0052915 | A1 | 3/2005 | Herner et al. |
| 2005/0098800 | A1 | 5/2005 | Herner et al. |
| 2005/0121742 | A1 | 6/2005 | Petti et al. |
| 2005/0121743 | A1 | 6/2005 | Herner |
| 2005/0124116 | A1 | 6/2005 | Hsu |
| 2005/0221200 | A1 | 10/2005 | Chen |
| 2005/0226067 | A1 | 10/2005 | Herner et al. |
| 2006/0073642 | A1 | 4/2006 | Yeh et al. |
| 2006/0076549 | A1 | 4/2006 | Ufert |
| 2006/0171200 | A1 | 8/2006 | Rinerson et al. |
| 2006/0197115 | A1 | 9/2006 | Toda |
| 2006/0197180 | A1 | 9/2006 | Lai et al. |
| 2006/0203541 | A1 | 9/2006 | Toda |
| 2006/0249753 | A1 | 11/2006 | Herner et al. |
| 2006/0250837 | A1 | 11/2006 | Herner et al. |
| 2006/0268594 | A1 | 11/2006 | Toda |
| 2006/0273298 | A1 | 12/2006 | Petti et al. |
| 2007/0008773 | A1 | 1/2007 | Scheuerlein |
| 2007/0015330 | A1 | 1/2007 | Li et al. |
| 2007/0015348 | A1 | 1/2007 | Hsu et al. |
| 2007/0069241 | A1 | 3/2007 | Yang et al. |
| 2007/0072360 | A1 | 3/2007 | Kumar et al. |
| 2007/0087508 | A1 | 4/2007 | Herner |
| 2007/0190722 | A1 | 8/2007 | Herner |
| 2007/0228414 | A1 | 10/2007 | Kumar et al. |
| 2007/0228442 | A1 | 10/2007 | Kakimoto |
| 2008/0090337 | A1 | 4/2008 | Williams |
| 2008/0239790 | A1 | 10/2008 | Herner et al. |
| 2009/0003036 | A1 | 1/2009 | Kumar |
| 2009/0026434 | A1 | 1/2009 | Malhotra et al. |
| 2009/0085154 | A1 | 4/2009 | Herner et al. |
| 2009/0086521 | A1 | 4/2009 | Herner et al. |
| 2009/0256130 | A1 | 10/2009 | Schricker |
| 2009/0257270 | A1 | 10/2009 | Schricker et al. |
| 2009/0272959 | A1 | 11/2009 | Phatak et al. |
| 2009/0272961 | A1 | 11/2009 | Miller et al. |
| 2009/0272962 | A1 * | 11/2009 | Kumar et al. .................... 257/4 |
| 2009/0283736 | A1 | 11/2009 | Kanzawa et al. |
| 2010/0085794 | A1 | 4/2010 | Chen et al. |
| 2010/0265750 | A1 | 10/2010 | Yan et al. |
| 2011/0002154 | A1 | 1/2011 | Mitani et al. |
| 2011/0037043 | A1 | 2/2011 | Wada |
| 2011/0062557 | A1 | 3/2011 | Bandyopadhyay et al. |
| 2011/0069532 | A1 | 3/2011 | Ichihara et al. |
| 2011/0085370 | A1 | 4/2011 | Chen et al. |
| 2011/0089391 | A1 | 4/2011 | Mihnea et al. |
| 2011/0140762 | A1 * | 6/2011 | Jiang et al. .................... 327/365 |
| 2011/0149634 | A1 | 6/2011 | Schloss et al. |
| 2011/0194329 | A1 | 8/2011 | Ohba et al. |
| 2011/0310653 | A1 | 12/2011 | Kreupl |
| 2011/0310654 | A1 | 12/2011 | Kreupl |
| 2011/0310655 | A1 | 12/2011 | Kreupl |
| 2011/0310656 | A1 | 12/2011 | Kreupl |
| 2012/0018695 | A1 | 1/2012 | Lee et al. |
| 2012/0091427 | A1 | 4/2012 | Chen et al. |
| 2012/0170353 | A1 | 7/2012 | Iijima et al. |
| 2012/0313069 | A1 | 12/2012 | Wang et al. |
| 2013/0026438 | A1 | 1/2013 | Wang et al. |
| 2013/0028003 | A1 | 1/2013 | Wang et al. |
| 2013/0056700 | A1 | 3/2013 | Wang et al. |
| 2013/0065377 | A1 | 3/2013 | Gopal et al. |
| 2013/0148404 | A1 | 6/2013 | Bandyopadhyay et al. |

OTHER PUBLICATIONS

Tirano, S. et al., "Accurate Analysis of Parasitic Current Overshoot During Forming Operation in RRAMs," CEA-LETI, France; Microelectronic Engineering 88, 2011, pp. 1129-1132.

(56) References Cited

OTHER PUBLICATIONS

Hierber, K., "Amorphous Chromium-Silicon: A Material for Kilo-Ohm Sheet Resistances, Siemens Aktiengesellschaft," Thin Solid Films, 57 (1979), pp. 353-357.
Wang, J. et al., "Thin Film Embedded Resistors," Gould Electronics, 6 pages.
Chen, C. et al., "Nitrogen Implanted Polysilicon Resistor for High-Voltage CMOS Technology Application," Academia—National Cheng Kung University, Taiwan; IEEE Electron Device Letters vol. 22 No. 11; Nov. 2011, pp. 524-526.
Chen, A., "Current Overshoot During Set and Reset Operations of Resistive Switching Memories," IEEE; 2012, pp. MY2.1- MY2.4.
Nardi, F. et al., "Reset Current Reduction and Set-Reset Instabilities in Unipolar NiO RRAM," IEEE, 2011, 4 pages.
Muller et al., "Device Electronics for Integrated Circuits, Second Edition", John Wiley & Sons, Inc., (1986), 192-200.
Li et al., Evaluation of SiO2 Antifuse in a 3D-OTP Memory, IEEE Transactions on Device and Materials Reliability, vol. 4, No. 3, Sep. 2004, pp. 416-421.
Herner et al., "Vertical p-i-n Polysilicon Diode With Antifuse for Stackable Field-Programmable ROM," IEEE Electron Device Letters, vol. 25, No. 5, May 2004, pp. 271-273.
Herner et al., "Polycrystalline silicon/CoSi2 Schottky diode with integrated SiO2 antifuse: a nonvolatile memory cell," Applied Physics Letters, vol. 82, No. 23, 2004.
McPherson et al., "Proposed Universal Relationship Between Dielectric Breakdown and Dielectric Constant," IEEE International Electron Devices Meeting, 2002, pp. 26.6.1-4.
McPherson et al., "Trends in the Ultimate Breakdown Strength of High Dielectric-Constant Materials", IEEE Transactions on Electron Devices, vol. 50, No. 8, (Aug. 2003), 1771-1778.
King, et al., "Punchthrough Diode as the Transient Voltage Suppressor for Low-Voltage Electronics", Nov. 1, 1996, 4 pages, vol. 43, No. 11, IEEE Transactions on Electron Devices, IEEE Service Center, Pisacataway, NJ, USA.
Chen et al. U.S. Appl. No. 13/465,263, filed May 7, 2012.
Herner et al., "Vertical p-i-n Polysilicon Memory Switching: Electrothermal-Induced Order," IEEE Trans. Electron Devices, 53.9, pp. 2320-2327, Sep. 2006.
Bandyopadhyay et al., U.S. Appl. No. 13/780,089, filed Feb. 28, 2013.
International Search Report and Written Opinion of International Application No. PCT/US12/066398 dated Dec. 19, 2012.
Tendulkar et al., U.S. Appl. No. 13/354,006, filed Jan. 19, 2012.
Tendulkar et al., U.S. Appl. No. 13/399,815, filed Feb. 17, 2012.
Meyer, R., et al. "Oxide Dual-Layer Memory Element for Scalable Non-Volatile Cross-Point Memory, Technology", 9th Annual, Non-Volatile Memory Technology Symposium, Nov. 11-14, 2008, pp. 54-58.
L.M. Levinson, "Electronic Ceramics: Properties, Devices, and Applications," (1988), p. 293.
Phatak et al., U.S. Appl. No. 13/189,065, filed Oct. 6, 2011.
Guo, X. et al.; "Tunneling Leakage Current in Oxynitride: Dependence on Oxygen/Nitrogen Content," Yale University (New Haven, CT); IEEE Electron Device Letters vol. 19, No. 6, Jun. 1998, pp. 207-209.
Final Office Action dated Aug. 29, 2013 in U.S. Appl. No. 13/399,530.
Notice of Allowance and Fee(s) Due dated Aug. 5, 2013 in U.S. Appl. No. 13/399,815.
Notice of Allowance and Fee(s) Due dated Sep. 16, 2013 in U.S. Patent Application No. 13/354,006.
Office Action dated Sep. 12, 2013 in U.S. Appl. No. 13/314,580.
Notice of Allowance and Fee(s) Due dated Oct. 17, 2013 in U.S. Appl. No. 13/223,950.
Final Office Action dated Oct. 24, 2013 in U.S. Appl. No. 13/465,263.
Response to Office Action filed Oct. 28, 2013 in U.S. Appl. No. 13/399,530.
U.S. Appl. No. 14/075,036 filed Nov. 8, 2013.
Notice of Allowance and Fee(s) Due dated Nov. 20, 2013 in U.S. Appl. No. 13/354,006.
Notice of Allowance and Fee(s) Due dated Nov. 1, 2013 in U.S. Appl. No. 13/353,000.
Notice of Allowance and Fee(s) Due dated Nov. 4, 2013 in U.S. Appl. No. 13/399,815.
Response to Office Action filed Dec. 12, 2013 in U.S. Appl. No. 13/314,580.

* cited by examiner

NONVOLATILE RESISTIVE MEMORY ELEMENT WITH A PASSIVATED SWITCHING LAYER

BACKGROUND

1. Field of the Invention

This invention relates to nonvolatile resistive memory elements, and more particularly, to a nonvolatile resistive memory element with a passivated switching layer and methods for forming the same.

2. Description of the Related Art

Nonvolatile memory elements are used in devices requiring persistent data storage, such as digital cameras and digital music players, as well as in computer systems. Electrically-erasable programmable read only memory (EPROM) and NAND flash are nonvolatile memory technologies currently in use. However, as device dimensions shrink, scaling issues pose challenges for traditional nonvolatile memory technology. This has led to the investigation of alternative nonvolatile memory technologies, including resistive switching nonvolatile memory.

Resistive switching nonvolatile memory is formed using memory elements that are bistable, i.e., having two stable states with different resistances. A bistable memory element can be placed in a high resistance state or a low resistance state by application of suitable voltages or currents. Voltage pulses are typically used to switch the bistable memory element from one resistance state to the other. Subsequently, nondestructive read operations can be performed on the memory element to ascertain the value of a data bit that is stored therein.

As resistive switching memory device sizes shrink, it is important to reduce the required currents and voltages that are necessary to reliably set, reset and/or determine the desired "on" and "off" states of the device, thereby minimizing power consumption of the device, resistive heating of the device, and cross-talk between adjacent devices. In addition, reliable retention of data by such devices for longer periods is highly desirable.

Because a bistable memory element formed with relatively few oxygen vacancies formed therein can result in lower operating voltages and currents, it is generally desirable to minimize the number of oxygen vacancies formed in bistable memory elements. However, a bistable memory element with a small number of oxygen vacancies is inherently more likely to experience data retention issues, since the loss or migration of even a small number of oxygen vacancies in such a memory element can change the resistive state of the memory element, thereby resulting in data loss. Thus, there is a trade-off in the design of resistive bistable memory elements between those configurations having lower operating voltages and currents, which benefit from having fewer oxygen vacancies, and those configurations having higher endurance and reliability, which benefit from having more oxygen vacancies.

In light of the above, there is a need in the art for nonvolatile resistive switching memory devices having reduced current and voltage requirements and robust data retention properties.

SUMMARY

Embodiments of the invention set forth a nonvolatile resistive memory element with a novel variable resistance layer and methods of forming the same. The novel variable resistance layer is passivated with non-metallic dopant atoms either during or after deposition of the switching layer, so that the switching layer requires reduced switching current and has improved data retention properties. Elements suitable for use as non-metallic dopant atoms include nitrogen (N), fluorine (F), and chlorine (Cl).

According to one embodiment of the present invention, a method of forming a nonvolatile memory element includes the steps of forming a variable resistance layer comprising a metal oxide above a first electrode layer, wherein the variable resistance layer comprises up to 3 atomic percent non-metallic dopant atoms, and forming a second electrode layer, so that the variable resistance layer is disposed between the first electrode layer and the second electrode layer.

According to another embodiment of the present invention, a nonvolatile memory element comprises a first electrode layer formed on a substrate, a second electrode layer, and a variable resistance layer comprising a metal oxide disposed between the first electrode layer and the second electrode, wherein at least a portion of the variable resistance layer comprises up to 3 atomic percent dopant atoms.

BRIEF DESCRIPTION OF THE DRAWINGS

So that the manner in which the above recited features of embodiments of the invention can be understood in detail, a more particular description of embodiments of the invention, briefly summarized above, may be had by reference to the appended drawings. It is to be noted, however, that the appended drawings illustrate only typical embodiments of this invention and are therefore not to be considered limiting of its scope, for the invention may admit to other equally effective embodiments.

For clarity, identical reference numbers have been used, where applicable, to designate identical elements that are common between figures. It is contemplated that features of one embodiment may be incorporated in other embodiments without further recitation.

DETAILED DESCRIPTION

Materials used as the switching layer of a nonvolatile resistive memory element are generally required to have bistable properties and, ideally, can be operated with low switching current while having extended data retention properties. Embodiments of the invention set forth a nonvolatile memory element having a novel variable resistance layer that satisfies these requirements. The novel variable resistance layer includes a metal oxide that comprises up to 3 atomic percent anionic non-metallic dopant atoms.

Figure 1:
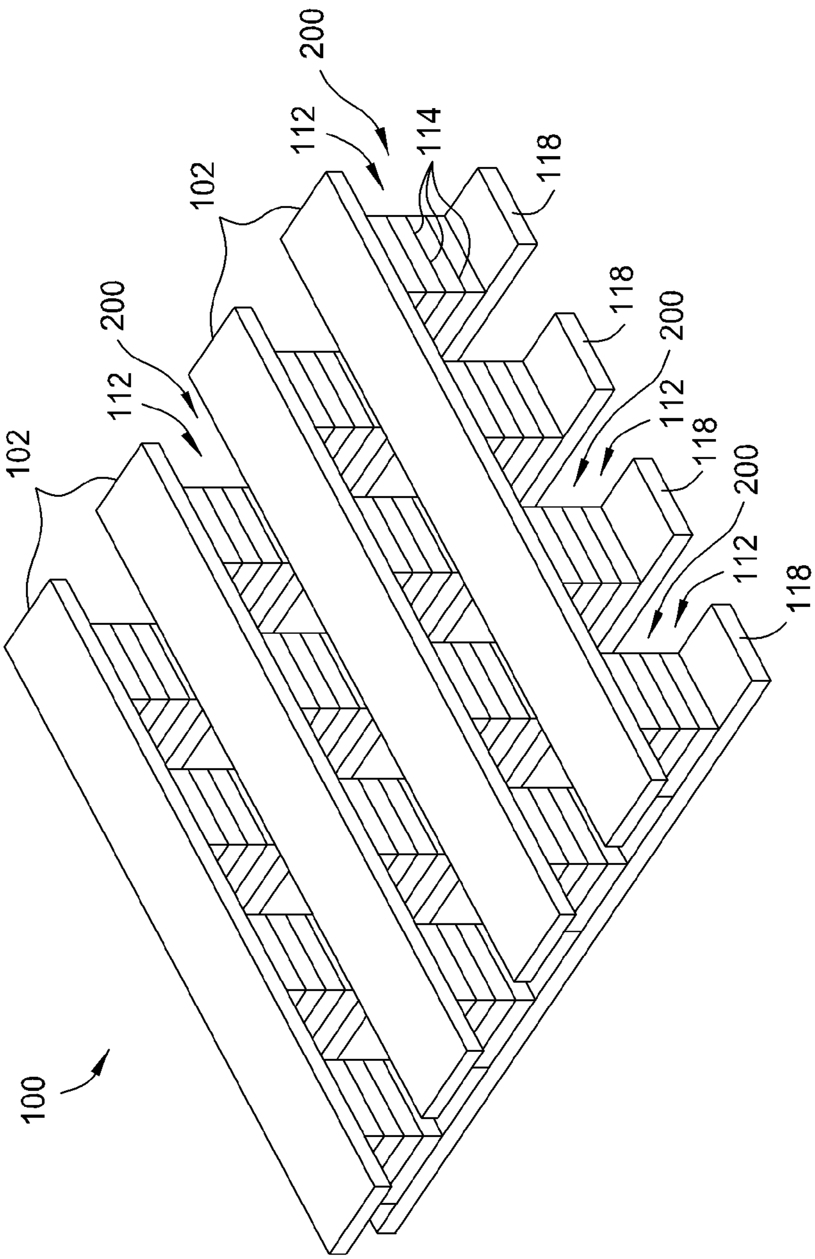
FIG. 1 is a perspective view of a memory array of memory devices, configured according to embodiments of the invention.

FIG. 1 is a perspective view of a memory array 100 of memory devices 200, configured according to embodiments of the invention. Memory array 100 may be part of a larger memory device or other integrated circuit structure, such as a system-on-a-chip type device. Memory array 100 may be formed as part of a high-capacity nonvolatile memory integrated circuit, which can be used in various electronic devices, such as digital cameras, mobile telephones, handheld computers, and music players. For clarity, memory array 100 is illustrated as a single layer memory array structure. However, memory arrays such as memory array 100 can also be stacked in a vertical fashion to make multilayer memory array structures.

Each of memory devices 200 comprises a nonvolatile resistive switching memory device, such as a resistive random access memory (ReRAM) device. Memory device 200 comprises a novel memory element 112 that may be formed from one or more material layers 114. Material layers 114 include a novel variable resistance layer comprising a metal nitride, a metal oxide-nitride, or a combination of each, and is described below in conjunction with FIG. 4. In some embodiments, memory device 200 also includes a current steering device, which is described below in conjunction with FIGS. 2A, 2B.

Read and write circuitry (not shown) is connected to memory devices 200 using electrodes 102 and electrodes 118. Electrodes 102 and electrodes 118, which are sometimes referred to as "bit lines" and "word lines," and are used to read and write data into memory elements 112 in memory devices 200. Individual memory devices 200 or groups of memory devices 200 can be addressed using appropriate sets of electrodes 102 and electrodes 118.

Figure 2A:
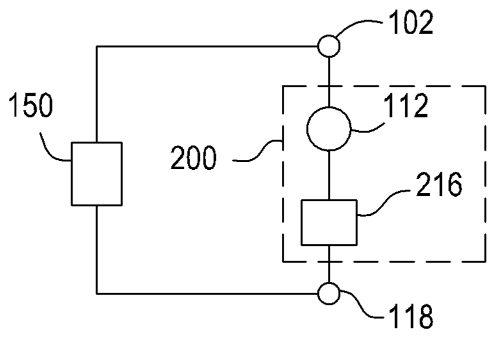
FIG. 2A is a schematic cross-sectional view of a memory device, configured in accordance with an embodiment of the invention.

FIG. 2A is a schematic diagram of a memory device 200 configured in accordance with an embodiment of the invention. Memory device 200 includes memory element 112 and in some embodiments current steering device 216, which are both disposed between electrodes 102 and electrodes 118. In one embodiment, current steering device 216 comprises an intervening electrical component, such as a p-n junction diode, p-i-n diode, transistor, or other similar device that is disposed between electrode 102 and memory element 112, or between electrode 118 and memory element 112. In some embodiments, current steering device 216 may include two or more layers of semiconductor material, such as two or more doped silicon layers, that are configured to allow or inhibit the current flow in different directions through the memory element 112. In addition, read and write circuitry 150 is coupled to memory device 200 via electrodes 102 and electrodes 118 as shown. Read and write circuitry 150 is configured to both sense the resistance state and set the resistance state of memory device 200.

Figure 2B:
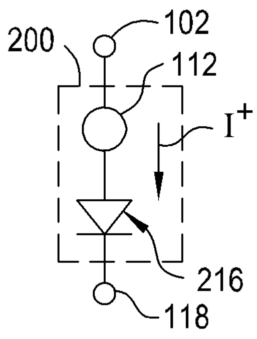
FIG. 2B schematically illustrates a memory device configured to allow current to flow through the memory device in a forward direction, according to embodiments of the invention.

FIG. 2B schematically illustrates memory device 200 configured to allow current to flow through memory device 200 in a forward direction ("$I^+$"), according to embodiments of the invention. However, due to the design of current steering device 216, a reduced current can also flow in the opposing direction through the device by the application of a reverse bias to electrodes 102 and electrodes 118.

During a read operation, read and write circuitry 150 applies a read voltage $V_{READ}$, e.g., +0.5 volts (V), across resistive switching memory element 112 using an appropriately selected electrode 102 and electrode 118 in memory array 100. Read and write circuitry 150 then senses the resultant current passing through memory device 200. A relatively high "on" current value ($I_{ON}$) indicates that memory element 112 is in its low resistance state, and a relatively low "off" current value ($I_{OFF}$) indicates that memory element 112 is in its high resistance state. Depending on its history, the particular memory element 112 that is addressed in this way may be in either a high resistance state (HRS) or a low resistance state (LRS). The resistance of memory element 112 therefore determines what digital data is being stored therein. For example, if memory element 112 is in the high resistance state, memory element 112 may be said to contain a logical zero (i.e., a "0" bit). If, on the other hand, memory element 112 is in the low resistance state, memory element 112 may be said to contain a logical one (i.e., a "1" bit).

Figure 3:
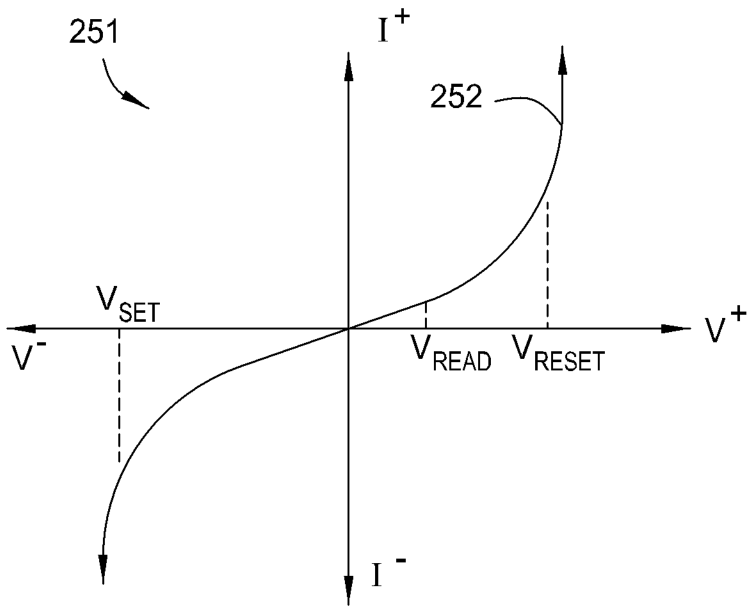
FIG. 3 sets forth a log-log plot of current versus voltage of a bipolar switching curve for one embodiment of a memory element, according to an embodiment of the invention.

During a write operation, the resistive state of a particular memory element 112 in memory array 100 is changed by application of suitable write signals to an appropriate set of electrodes 102 and electrodes 118 by read and write circuitry 150. In some embodiments, to affect such a change, bipolar switching is used, where opposite polarity "set" and "reset" voltages are used to alter the resistance of a selected memory element 112 between high and low resistance states. FIG. 3 sets forth a log-log plot 251 of current (I) versus voltage (V) of a bipolar switching curve 252 for one embodiment of memory element 112, and thus illustrates typical threshold values used to set and reset the contents of memory element 112. For example, memory element 112 may initially be in a high resistance state (e.g., storing a logical "zero"). To store a logical "one" in memory element 112, memory element 112 is placed into its low-resistance state. This may be accomplished by using read and write circuitry 150 to apply a "set" voltage $V_{SET}$ (e.g., −2 V to −4 V) across electrodes 102 and electrodes 118 so that a "set" current $I_{SET}$ passes through memory element 112. In one embodiment, applying a negative $V_{SET}$ voltage to memory element 112 causes memory element 112 to switch to its low resistance state. In this region, the memory element 112 is changed so that, following removal of the "set" voltage $V_{SET}$, memory element 112 is characterized by a low resistance state. Conversely, to store a logical "zero" in memory element 112, the memory element can once again be placed in its high resistance state by applying a positive "reset" voltage $V_{RESET}$ (e.g., +2 V to +5 V) across memory element 112, so that a "reset" current $I_{RESET}$ passes through memory element 112. When read and write circuitry 150 applies $V_{RESET}$ to memory element 112, memory element 112 enters its high resistance state. When "reset" voltage $V_{RESET}$ is removed from memory element 112, memory element 112 will once again be characterized by high resistance when read voltage $V_{READ}$ is applied. While the discussion of the memory element 112 herein primarily provides bipolar switching examples, some embodiments of the memory elements 112 may use unipolar switching, where the "set" and "reset" voltages have the same polarity, without deviating from the scope of the invention described herein.

In an effort to prepare the memory element 112 for use, it is common to apply a forming voltage $V_{FORM}$ at least once across electrodes 102 and electrodes 118 to "burn-in" each memory device 200 of memory array 100. It is believed that the application of forming voltage $V_{FORM}$, which is typically significantly greater than the $V_{RESET}$ and $V_{SET}$ voltages, causes the defects that are formed within a variable resistance layer 206 (illustrated in FIG. 4) during the device fabrication process to move, align and/or collect within various regions of the layer, causing variable resistance layer 206 to consistently and reliably switch between the "on" and "off" resistive states throughout the memory element's life. In one embodiment, forming voltage $V_{FORM}$ is between about 1 and about 5 times greater than the $V_{RESET}$ or $V_{SET}$ voltage. In one example, the forming voltage is between about 1.4 and about 2.5 times greater than the $V_{RESET}$ or $V_{SET}$ voltage. In one example, the forming voltage is between about 3 and about 7 volts. However, it is noted that in some cases it is desirable to form memory element 112 so that the application of a forming voltage is not required at all to assure that the device will perform as desired throughout its life.

It is believed that the change in the resistive state of the memory element 112 may be "trap-mediated" (i.e., changes in resistive state are due to the redistribution or filling of traps or defects in a variable resistance layer of memory element 112 when memory device 200 is reverse biased). When the variable resistance layer comprises a metal oxide, sometimes referred to as a host oxide, the defects or traps are generally thought to be oxygen vacancies formed during the deposition and/or the initial "burning-in" (or "forming") of the variable resistance layer. Such oxygen vacancies are likely created in the variable resistance layer by making the metal/oxygen ratio larger than that for exact stoichiometry in the variable resistance layer. The oxygen vacancies may also be formed by the breaking of metal oxide bonds followed by the displacement of oxygen atoms from their atomic sites by either electrical or chemical means. One possible chemical means is the introduction of nitrogen atoms into the metal oxide material of the variable resistance layer. In this case, to maintain charge neutrality, two nitrogen atoms, each with one negative charge, creates one oxygen vacancy with a net charge of "+2". The electrical resistance of the variable resistance layer is largely determined by the total number of such oxygen vacancies formed in the variable resistance layer and the ability of such vacancies to transport electrons through the variable resistance layer.

The relationship between the switching currents (i.e., "set" current $I_{SET}$ and "reset" current $I_{RESET}$) required to switch a variable resistance layer and the number of vacancies contained therein is quantified by Equation 1:

$$I_{switch}=\alpha^{*}N_{vac} \quad (1)$$

where $I_{SWITCH}$=switching current that passes through the variable resistance layer at a desired $V_{SET}$ and $V_{RESET}$; α=a factor indicative of the average ability of oxygen vacancies in the variable resistance layer to transport electrons when $V_{SET}$ or $V_{RESET}$ is applied across the variable resistance layer; and $N_{VAC}$=the number of oxygen vacancies in the variable resistance layer. Both electron transport factor α and the number of vacancies $N_{VAC}$ may vary based on the specific material of the variable resistance layer as well as how the variable resistance layer is formed. It is noted that switching current $I_{SWITCH}$ of a variable resistance layer is inversely proportional to the resistance of the variable resistance layer, so that as the resistance of the variable resistance layer increases, switching current $I_{SWITCH}$ decreases proportionally. Thus, the resistance of a particular variable resistance layer, for example a hafnium oxide ($HfO_x$) layer, can be adjusted by altering electron transport factor α and/or the number of vacancies $N_{VAC}$.

Reducing the number of vacancies $N_{VAC}$ in the variable resistance layer increases electrical resistance of the variable resistance layer, advantageously reducing the switching current $I_{SWITCH}$. However, a variable resistance layer formed with a relatively small number of vacancies $N_{VAC}$ is inherently more likely to experience data retention issues over the life of a memory element containing the variable resistance layer. This is because a small change in the number of vacancies $N_{VAC}$ that occurs while a datum is stored in the memory element can produce an undesirably large change in the resistance of the variable resistance layer. When such a resistance change is sufficiently large, the resistive state of the variable resistance layer changes, resulting in loss of the datum. This behavior is quantified in Equation 2:

$$\frac{\Delta R}{R}=\frac{\Delta N_{vac}}{N_{vac}} \quad (2)$$

where R=the resistance of a variable resistance layer in a specific resistive state; ΔR=a change in resistance R of the variable resistance layer in response to a change $\Delta N_{VAC}$ in the number of oxygen vacancies in the variable resistance layer; $N_{VAC}$=the number of oxygen vacancies present in the variable resistance layer; and $\Delta N_{VAC}$=a change in the number of oxygen vacancies $N_{VAC}$ in the variable resistance layer during a period of time in which a datum is stored in the variable resistance layer. Equation 2 indicates that when the number of oxygen vacancies $N_{VAC}$ is relatively small, e.g., 5 or 10, the change $\Delta N_{VAC}$ in the number of vacancies can be relatively small, e.g., 1 to 5, and still produce a large change ΔR in resistance. This is because change ΔR is proportional to the ratio of change $\Delta N_{VAC}$ to the number of oxygen vacancies $N_{VAC}$. Equation 2 is in agreement with observations indicating that nonvolatile resistive switching memory devices that have low switching currents $I_{SWITCH}$ are known to have data retention issues.

Embodiments of the invention contemplate a variable resistance layer that is passivated with non-metallic dopant atoms either during or after deposition of the switching layer, so that the switching layer operates with reduced switching current and has improved data retention properties. The non-metallic dopant atoms can be either cationic or anionic depending on whether they replace the metal or oxygen ions respectively. In terms of Equation 1, the preferred types of dopant atoms are those that simultaneously increase the number of oxygen vacancies $N_{VAC}$ that are formed in the variable resistance layer and lowers electron transport factor α of the variable resistance layer. In this way, switching current $I_{SWITCH}$=can be maintained at a desired value without reducing the number of oxygen vacancies $N_{VAC}$ to an undesirably low value. Instead, the number of oxygen vacancies $N_{VAC}$ can be increased significantly, thereby improving the data retention properties of the variable resistance layer.

Specifically, the appropriate non-metallic dopant atoms either decrease formation energy of positively charged oxygen vacancies in the switching layer or increase the probability of the oxygen ions being displaced from their atomic sites, thereby increasing the number of charged vacancies created during the forming process. Thus, for the same forming voltage $V_{FORM}$, a larger number of charged vacancies (i.e., the number of oxygen vacancies $N_{VAC}$) are created in the variable resistance layer during the forming process. Concurrently, the non-metallic dopant atoms passivate oxygen vacancies present in the variable resistance layer, thereby reducing electron transport in the variable resistance layer, that is, reducing the value of electron transport factor α in Equation-1.

Figure 4:
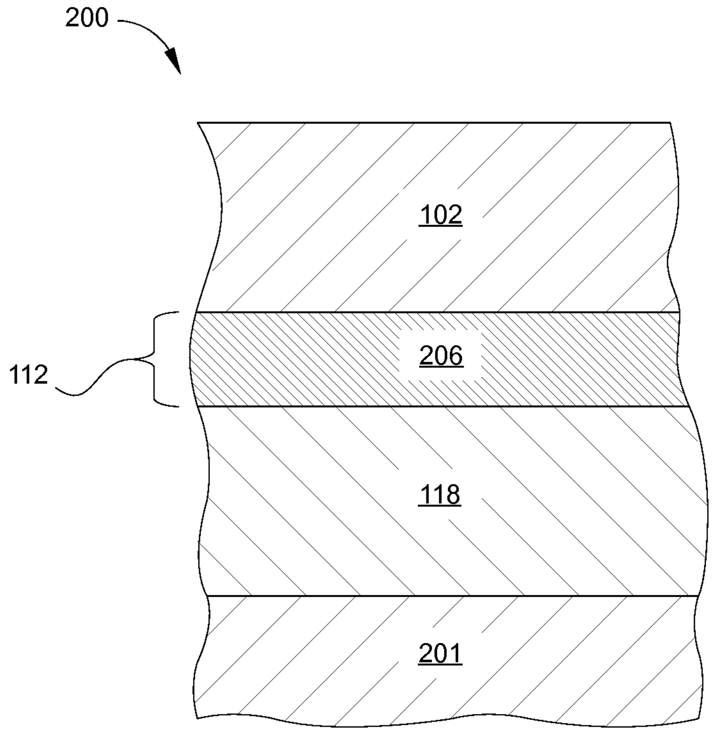
FIG. 4 is a schematic cross-sectional view of a memory device formed from a series of deposited layers, including a novel variable resistance layer, according to embodiments of the invention.

FIG. 4 is a schematic cross-sectional view of memory device 200 formed from a series of deposited layers, including a novel variable resistance layer 206, according to embodiments of the invention. In the embodiment illustrated in FIG. 4, memory device 200 is formed over, or integrated with and disposed over, portions of a surface of a substrate 201 (e.g., a silicon substrate or an SOI substrate). It is noted that relative directional terms used herein with regard to embodiments of the invention are for purposes of description only, and do not limit the scope of the invention. Specifically, directional terms such as "over," "above," "under," and the like are used under the assumption that substrate 201 on which embodiments are formed is a "bottom" element and is therefore "under" elements of the invention formed thereon.

In the embodiment illustrated in FIG. 4, memory device 200 comprises a memory element 112 disposed between electrodes 102, 118. Memory element 112 is a nonvolatile resistive memory element that includes variable resistance layer 206. In other embodiments, memory device 200 further comprises an optional intermediate electrode and optional current steering device 216 disposed between electrode 118 and variable resistance layer 206.

Electrodes 102, 118 are formed from conductive materials that have a desirable work function tailored to the bandgap of the material making up variable resistance layer 206. In some configurations, electrodes 102, 118 are formed from different materials so that electrodes 102, 118 have a work function that differs by a desired value, e.g., 0.1 eV, 0.5 eV, 1.0 eV, etc. For example, in one embodiment, electrode 102 is comprised of TiN, which has a work function of 4.5-4.6 eV, while electrode 118 can be n-type polysilicon, which has a work function of approximately 4.1-4.15 eV. Other electrode materials suitable for use in electrode 102 and/or electrode 118 include p-type polysilicon (4.9-5.3 eV), n-type polysilicon, transition metals, transition metal alloys, transition metal nitrides, transition metal carbides, tungsten (4.5-4.6 eV), tantalum nitride (4.7-4.8 eV), molybdenum oxide (~5.1 eV), molybdenum nitride (4.0-5.0 eV), iridium (4.6-5.3 eV), iridium oxide (~4.2 eV), ruthenium (~4.7 eV), and ruthenium oxide (~5.0 eV). Other potential electrode materials include a titanium/aluminum alloys (4.1-4.3 eV), nickel (~5.0 eV), tungsten nitride (~4.3-5.0 eV), tungsten oxide (5.5-5.7 eV), aluminum (4.2-4.3 eV), copper or silicon-doped aluminum (4.1-4.4 eV), copper (~4.5 eV), hafnium carbide (4.8-4.9 eV), hafnium nitride (4.7-4.8 eV), niobium nitride (~4.95 eV), tantalum carbide (approximately 5.1 eV), tantalum silicon nitride (~4.4 eV), titanium (4.1-4.4 eV), vanadium carbide (~5.15 eV), vanadium nitride (~5.15 eV), and zirconium nitride (~4.6 eV). In some embodiments, electrode 102 is a metal, metal alloy, metal nitride or metal carbide formed from an element selected from a group of materials consisting of titanium (Ti), tungsten (W), tantalum (Ta), cobalt (Co), molybdenum (Mo), nickel (Ni), vanadium (V), hafnium (Hf) aluminum (Al), copper (Cu), platinum (Pt), palladium (Pd), iridium (Ir), ruthenium (Ru), and combinations thereof. In one example, electrode 102 comprises a metal alloy selected from the group of a titanium/aluminum alloy ($Ti_xAl_y$), or a silicon-doped aluminum (AlSi).

Variable resistance layer 206 comprises a dielectric material that can be switched between two or more stable resistive states. In some embodiments, variable resistance layer 206 has a thickness of between about 10 and about 100 Å, and comprises one or more oxides of a transition metal, including but not limited to hafnium (Hf), zirconium (Zr), titanium (Ti), tantalum (Ta), aluminum (Al), lanthanum (La), yttrium (Y), dysprosium (Dy), and ytterbium (Yb). In addition, up to 3 atomic percent of variable resistance layer 206 comprises anionic non-metallic dopant atoms. Suitable dopant atoms for use in variable resistance layer 206 are anionic non-metallic dopants that remain substantially immobile after being introduced into variable resistance layer 206, even at the elevated temperatures that take place during the formation and integration of memory device 200 (e.g., 450 to 900° C.).

In one embodiment, nitrogen (N) is used as the non-metallic dopant atom. Nitrogen is a dopant that has been demonstrated to reduce current leakage in high-dielectric-constant gate oxides, such as hafnium oxide ($HfO_x$), by passivating oxygen vacancies in the gate oxide. In such applications, nitrogen dopants are also known to increase the fixed charge of the hafnium oxide layer. One of skill in the art will appreciate that while fixed charge is highly undesirable in the gate oxide of a complimentary metal oxide semiconductor (CMOS) transistor, increasing fixed charge in variable resistance layer 206 is a beneficial characteristic that improves data retention of memory device 200. In other embodiments, fluorine (F) and/or chlorine (Ch) are used as the non-metallic dopant atom.

Ideally, most or all oxygen vacancies in variable resistance layer 206 are passivated by dopant atoms. Consequently, a minimum desired dopant atom concentration in variable resistance layer 206 is equal to or greater than the estimated vacancy concentration, which may range from 5.0×10e16 to 5.0×10e19 vacancies per cubic centimeter. In embodiments in which nitrogen is used as the non-metallic dopant atoms, two nitrogen atoms are needed to passivate a single oxygen vacancy, and a minimum desired dopant atom concentration is equal to or greater than twice the estimated vacancy concentration. Because a significant portion of the dopant atoms introduced into variable resistance layer 206 may not be coincident with and coupled to an oxygen vacancy, in some embodiments, the concentration of dopant atoms introduced into variable resistance layer 206 is greater than the estimated vacancy concentration in variable resistance layer 206. In such embodiments, the concentration of non-metallic dopant atoms may be as high as 3 atomic percent, to ensure that most or all oxygen vacancies present in variable resistance layer 206 are passivated by dopant atoms. However, a concentration of dopant atoms greater than about 3 atomic percent is generally undesirable; at such high concentrations, dopant atoms behave in the same fashion as p-type dopants in a semiconductor, and increase the conductivity of variable resistance layer 206. As noted above, the intention of adding dopant atoms to variable resistance layer 206 is to achieve the opposite effect, i.e., reduced conductivity, therefore concentrations of dopant atoms are preferably no greater than about 3 atomic percent.

It is noted that the mere presence of dopant atoms in variable resistance layer 206 does not necessarily passivate oxygen vacancies as desired. Typically, the dopant atoms are disposed within variable resistance layer 206 rather than being part of the compound used to form variable resistance layer 206. Thus, dopant atoms that can effectively passivate oxygen vacancies are located in interstitial and/or substitutional locations in variable resistance layer 206. For example, the presence of nitrogen in the form of a nitride in any concentration in variable resistance layer 206 does not increase the number of oxygen vacancies $N_{VAC}$ or reduce electron transport factor $\alpha$. Consequently, the manner in which dopant atoms are introduced into variable resistance layer 206 determines whether such atoms effectively passivate oxygen vacancies. In some embodiments, dopant atoms are introduced into variable resistance layer 206 during the deposition of variable resistance layer 206. In other embodiments, dopant atoms are introduced into variable resistance layer 206 in a processing step after the deposition of variable resistance layer 206.

Figure 5:
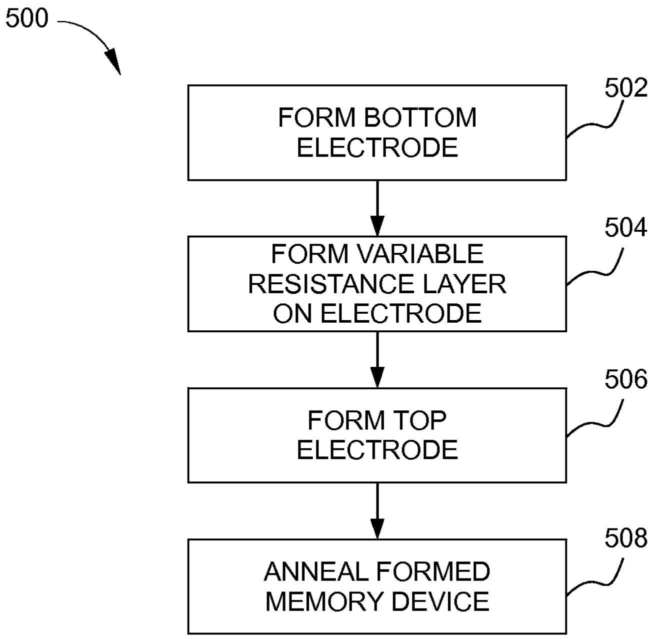
FIG. 5 sets forth a flowchart of method steps in a process sequence for forming a memory device, according to one embodiment of the invention.

FIG. 5 sets forth a flowchart of method steps in a process sequence 500 for forming memory device 200, according to embodiments of the invention. Although the method steps are described in conjunction with memory device 200 in FIG. 4, persons skilled in the art will understand that formation of other resistive switching memory devices using process sequence 500 is within the scope of the invention.

As shown, method 500 begins at step 502, in which electrode 118 is formed on substrate 201. In one embodiment, electrode 118 is a highly doped polysilicon layer that is formed on substrate 201 using a conventional CVD polysilicon deposition technique. In one embodiment, electrode 118 comprises polysilicon, and is between about 50 and about 5000 Å thick.

In step 504, variable resistance layer 206 is formed on or above electrode 118. In some embodiments, variable resistance layer 206 is formed on electrode 118 as shown in FIG. 4. In other embodiments, variable resistance layer 206 is formed on one or more intervening layers formed on electrode 118. Variable resistance layer 206 is formed using one or more deposition processes, so that variable resistance layer 206 includes one or more chemical elements that act as vacancy-passivating dopant atoms. Embodiments of the invention include various methods of depositing variable resistance layer 206, and depend in part on the specific composition of variable resistance layer 206 and the particular dopant atom included therein.

In some embodiments, dopant atoms are incorporated into variable resistance layer 206 in a processing step after the deposition of variable resistance layer 206. In such embodiments, variable resistance layer 206 is deposited to form a desired metal oxide layer, for example using a reactive physical vapor deposition (PVD) process. In reactive PVD, oxygen reacts with a sputtered metal (e.g., hafnium) to deposit the desired metal oxide film (e.g., hafnium oxide). In a subsequent processing step, desired dopant atoms (e.g., nitrogen) are incorporated into the deposited metal oxide film. For example, in one such embodiment, a hafnium oxide layer is deposited via reactive PVD in an oxygen or oxygen-argon ambient, and nitrogen atoms are incorporated into the deposited hafnium oxide film using thermal anneal in an ammonia ($NH_3$) ambient, decoupled plasma nitridization (DPN), or ion implant of nitrogen. In other such embodiments, any other technically feasible metal oxide deposition method known in the art may be used to deposit the metal oxide film used to form variable resistance layer 206 in step 504, including chemical vapor deposition (CVD), atomic layer deposition (ALD), etc.

In some embodiments, dopant atoms are incorporated into variable resistance layer 206 during the deposition of variable resistance layer 206. In one such embodiment, variable resistance layer 206 is deposited using a reactive PVD process to form a desired metal oxide layer doped with a desired concentration of dopant atoms. In such an embodiment, a low concentration of the dopant atom is introduced into the oxygen ambient during the deposition process, so that a desired concentration of the dopant atom is incorporated into the PVD metal oxide film. For example, in one embodiment a hafnium oxide layer is deposited via reactive PVD in an oxygen ambient that includes a trace concentration of nitrogen, for example 1 atomic % nitrogen. As the hafnium oxide film is being deposited, trace nitrogen atoms in the oxygen ambient are incorporated into the hafnium oxide film, thereby obviating the need for an additional processing step to introduce dopant atoms into variable resistance layer 206.

In step 506, electrode 102 is formed above variable resistance layer 206. Suitable materials for forming electrode 102 are described above in conjunction with FIG. 4. In some embodiments, electrode 102 is formed directly onto variable resistance layer 206 as shown in FIG. 4, and in other embodiments, electrode 102 is formed above variable resistance layer 206 on one or more intervening layers of memory element 112. Electrode 102 may be formed using any technically feasible deposition process, such as PVD, CVD, ALD or other similar processes, depending on the specific material used to form electrode 102. In one embodiment, electrode 102 is between about 500 Å and 1 μm thick.

In step 508, formed memory device 200 is thermally processed, e.g., via an anneal process. Temperature and duration of the anneal process is a function of the configuration of memory device 200 as well as the materials included in memory device 200. For example, in some embodiments, the anneal process takes place at a temperature of greater than about 450° C. In other embodiments, the anneal process takes place at a temperature of greater than about 600° C. In yet other embodiments, the anneal process takes place at a temperature of greater than about 1000° C. Duration of the anneal process can also vary greatly (e.g., varying between about 30 seconds and 20 minutes) depending on the configuration of memory device 200. Furthermore, vacuum anneals, oxygen anneals, anneals using gas mixtures, such as a hydrogen/argon mixture, and other anneal processes known in the art fall within the scope of the invention. Similarly, multiple thermal processing steps may be performed on memory device 200 without exceeding the scope of the invention. For example, a thermal process may be performed during or after multiple steps of method 500.

While embodiments of the invention are described herein in terms of resistive switching memory elements that are used to form memory arrays, embodiments of the present invention can be applied to other resistive memory devices without deviating from the basic scope of the invention described herein.

In sum, embodiments of the invention provide a nonvolatile resistive memory element with a novel variable resistance layer that is passivated with non-metallic dopant atoms and methods of forming the same. The non-metallic dopant atoms decrease formation energy of positively charged oxygen vacancies in the switching layer, thereby advantageously increasing the number of charged vacancies created during the forming process of the memory element. Furthermore, the dopant atoms passivate the oxygen vacancies, thereby reducing the current-carrying capability of the passivated oxygen vacancies and increasing the electrical resistance of the variable resistance layer. Thus, the novel variable resistance layer can operate with reduced switching current while having improved data retention properties.

While the foregoing is directed to embodiments of the present invention, other and further embodiments of the invention may be devised without departing from the basic scope thereof, and the scope thereof is determined by the claims that follow.

What is claimed is:

1. A method of forming a nonvolatile memory element, comprising:

forming a first layer operable as a variable resistance layer and comprising a metal oxide above a second layer operable as an electrode layer, wherein the first layer comprises up to 3 atomic percent non-metallic dopant atoms; and forming a third layer operable as an electrode layer, so that the first layer is disposed between the second layer and the third layer;

wherein the metal oxide comprises an oxide of Hf, Zr, Ti, Ta, Al, La, Y, Dy, or Yb, and wherein the non-metallic dopant atoms are disposed in interstitial locations to passivate oxygen vacancies in the metal oxide.

2. The method of claim 1, wherein forming the first layer comprises:

depositing the metal oxide; and incorporating non-metallic dopant atoms into the metal oxide.

3. The method of claim 2, wherein depositing the metal oxide is performed concurrently with incorporating non-metallic dopant atoms into the metal oxide.

4. The method of claim 2, wherein the metal oxide is deposited by atomic layer deposition (ALD).

5. The method of claim 2, wherein the non-metallic dopant atoms comprise nitrogen atoms.

6. The method of claim 5, wherein incorporating non-metallic dopant atoms into the metal oxide comprises a thermal anneal in an ammonia ($NH_3$) atmosphere.

7. The method of claim 5, wherein incorporating non-metallic dopant atoms into the metal oxide comprises a decoupled plasma nitridization process.

8. The method of claim 5, wherein incorporating non-metallic dopant atoms into the metal oxide comprises an ion implant process.

9. The method of claim 2, wherein the metal oxide is deposited by a reactive physical vapor deposition (PVD).

10. The method of claim 9, wherein the non-metallic dopant atoms comprise nitrogen atoms, and wherein incorporating the non-metallic dopant atoms into the metal oxide comprises including nitrogen gas in the reactive PVD.

11. The method of claim 10, wherein the metal oxide comprises hafnium oxide and the reactive PVD is performed in an atmosphere comprising oxygen and about 1 atomic % nitrogen.

12. The method of claim 2, wherein the metal oxide is deposited by chemical vapor deposition.

13. The method of claim 1, wherein the non-metallic dopant atoms comprise at least one chemical element selected from the group consisting of nitrogen, chlorine (Cl), and fluorine (F).

14. The method of claim 1, wherein the first layer has a thickness that is between about 10 and 100 angstroms (Å).

15. A nonvolatile memory element, comprising:

a first layer operable as an electrode layer and formed over a substrate;

a second layer operable as an electrode layer; and a third layer operable as a variable resistance layer and comprising a metal oxide disposed between the first layer and the second layer, wherein at least a portion of the third layer comprises up to 3 atomic percent non-metallic dopant atoms;

wherein the metal oxide comprises an oxide of Hf, Zr, Ti, Ta, Al, La, Y, Dy, or Yb, and wherein the non-metallic dopant atoms are disposed in interstitial locations to passivate oxygen vacancies in the metal oxide.

16. The nonvolatile memory element of claim 15, wherein the non-metallic dopant atoms comprise at least one chemical element selected from the group consisting of nitrogen, chlorine, and fluorine.

17. The nonvolatile memory element of claim 15, wherein the non-metallic dopant atoms comprise nitrogen atoms.

* * * * *